(12) United States Patent
Umezawa

(10) Patent No.: US 7,457,492 B2
(45) Date of Patent: Nov. 25, 2008

(54) MULTICHANNEL OPTICALCOMMUNICATION MODULE AND METHOD OF PRODUCING MULTICHANNEL OPTICALCOMMUNICATION MODULE

(75) Inventor: Tomoki Umezawa, Ebina (JP)

(73) Assignee: Fuji Xerox Co., Ltd., Tokyo (JP)

( * ) Notice: Subject to any disclaimer, the term of this patent is extended or adjusted under 35 U.S.C. 154(b) by 0 days.

(21) Appl. No.: 11/544,741

(22) Filed: Oct. 10, 2006

(65) Prior Publication Data

US 2007/0183789 A1    Aug. 9, 2007

(30) Foreign Application Priority Data

Feb. 7, 2006    (JP) .............................. 2006-030075

(51) Int. Cl.
G02B 6/12    (2006.01)

(52) U.S. Cl. .............................. 385/14; 385/53; 385/54; 385/55; 385/56; 385/58; 385/63; 385/65; 385/70; 385/71; 385/88; 385/89; 385/129; 385/130; 385/131; 385/132

(58) Field of Classification Search ....................... None
See application file for complete search history.

(56) References Cited

U.S. PATENT DOCUMENTS 6,112,002 A * 8/2000 Tabuchi ........................ 385/50

6,341,189 B1 * 1/2002 Deacon ........................ 385/130
6,798,932 B2 * 9/2004 Kuhara et al. ................. 385/14
6,821,027 B2 * 11/2004 Lee et al. ...................... 385/89
2003/0152338 A1    8/2003 Kuhara et al.
2004/0114866 A1 * 6/2004 Hiramatsu .................... 385/39

FOREIGN PATENT DOCUMENTS

CN    1593817    3/2005
JP    11-352362    12/1999

* cited by examiner

*Primary Examiner*—Sung Pak
*Assistant Examiner*—Chad H Smith
(74) *Attorney, Agent, or Firm*—Morgan, Lewis & Bockius LLP

(57) ABSTRACT

A multichannel optical communication module includes: a board, and a signal-converting element having optical-action points aligned with a first pitch to emit and receive signal light. The element performs conversion between an optical signal and an electric signal at each of the optical-action points. The module further includes an optical waveguide that includes optical waveguide cores each having a first and a second optical-signal ends that are opposed to each other. The first optical-signal ends are aligned with the first pitch and optically connected to the respective optical-action points, while the second optical-signal ends are aligned with a second pitch longer than the first pitch. The module further includes a coupling component fixed on the board and coupling, to the module, an optical connector that holds ends of optical fibers aligned with a pitch equal to the second pitch, thereby optically connecting the second optical-signal ends to the optical fibers.

7 Claims, 4 Drawing Sheets

MULTICHANNEL OPTICALCOMMUNICATION MODULE AND METHOD OF PRODUCING MULTICHANNEL OPTICALCOMMUNICATION MODULE

BACKGROUND (i) Technical Field

The invention relates to a multichannel optical communication module that is disposed in a terminal and performs transmission and reception of optical signals in an optical communication system, and to a method of producing the multichannel optical communication module.

(ii) Related Art

In recent years, various types of optical communication systems have been developed with the increasing amount of transmitted information and high-speed information transfer rate.

In the opticalcommunication systems, generally, a light-emitting element for converting an electric signal into an optical signal and a light-receiving element for converting an optical signal into an electric signal, which are each known as a signal (signal-medium) converting element, are connected to each other with a signal-light transmitting medium such as an optical fiber and an optical waveguide. As a component for optically connecting the signal-converting element to the signal-light transmitting medium, an optical communication module is widely used.

Also, recent optical communication systems have improved in multichannel performance in order to handle the increasing amount of transmitted information. Accordingly, there have been proposed a large number of multichannel optical communication modules that can be used in the optical communication systems thus improved.

SUMMARY

A multichannel optical communication module according to an aspect of the invention includes:

a board;

a signal-converting element that has optical-action points aligned with a predetermined first pitch to emit and receive signal light, the signal-converting element performing conversion between an optical signal and an electric signal at each of the optical-action points;

an optical waveguide that includes optical waveguide cores each having a first optical-signal end and a second optical-signal end that are opposed to each other, the first optical-signal ends being aligned with a first pitch and optically connected to the respective optical-action points, while the second optical-signal ends being aligned with a second pitch longer than the first pitch; and an optical-connector coupling component that is fixed on the board and couples, to the module, an optical connector that holds ends of optical fibers aligned with a pitch equal to the second pitch, thereby optically connecting the second optical-signal ends to the optical fibers.

BRIEF DESCRIPTION OF THE DRAWINGS

Exemplary embodiment(s) of the present invention will be described in detail based on the following figures, wherein.

DETAILED DESCRIPTION

Figure 1:
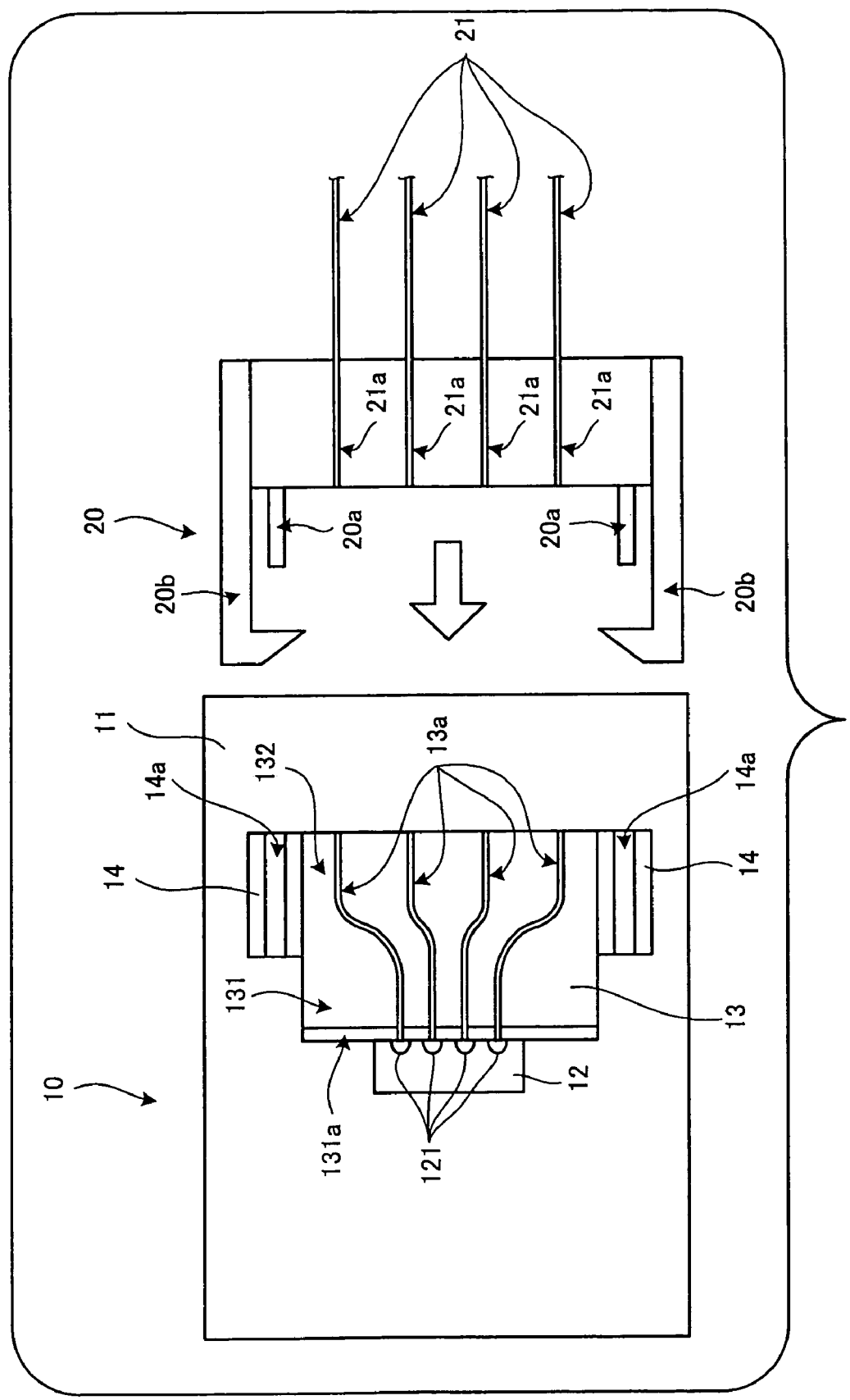
FIG. 1 is a schematic diagram showing a multichannel optical communication module according to a first exemplary embodiment of the invention.

Referring now to the drawings, exemplary embodiments of the invention will be described.

FIG. 1 is a schematic diagram showing a multichannel optical communication module 10 according to a first exemplary embodiment of the invention.

FIG. 1 shows, in addition to the multichannel optical communication module 10, an optical connector 20 that holds each end 21a of four optical fibers 21.

The optical communication module 10 shown in FIG. 1 has a board 11, a light-emitting/receiving element array 12, a film-shaped optical waveguide 13 and an optical-connector coupling component 14. The light-emitting/receiving element array 12 and the optical-connector coupling component 14 are fixed on the board 11. The board 11 is an example of the "board" according to the invention, and the light-emitting/receiving element array 12 is an example of the "signal-converting element" according to the invention. The optical waveguide 13 is an example of the "optical waveguide" according to the invention, and the optical-connector coupling component 14 is an example of the "optical-connector coupling component" according to the invention.

The light-emitting/receiving element array 12 shown in FIG. 1 is electrically connected to the board 11 with, for example, a wirebond. The array 12 has four optical-action points 121 that are aligned with a predetermined first pitch and emit or receive signal light. The array 12 performs conversion between an optical signal and an electric signal at each of the optical-action points 121. The optical-action points 121 of the array 12 emit or receive signal light traveling in the direction perpendicular to the surface of the board 11.

The optical waveguide 13 shown in FIG. 1 includes four optical waveguide cores 13a each having a first optical-signal end 131 and a second optical-signal end 132 that are opposed to each other. The first optical-signal ends 131 are aligned with a pitch equal to the first pitch and optically connected to the respective optical-action points 121. The second optical-signal ends 132 are aligned with a second pitch longer than the first pitch. The first optical-signal ends 131 have an optical-waveguide changing section 131a that changes the traveling direction of signal light from the direction perpendicular to the surface of the board 11 to the direction parallel to the surface of the board 11, and vice versa.

The optical-connector coupling component 14 shown in FIG. 1 is a component that couples the optical connector 20 to the optical communication module 10, thereby optically connecting the second optical-signal ends 132 of the module 10 to the ends 21a of the respective optical fibers 21 of the optical connector 20. The optical fibers 21 are aligned with a pitch equal to the second pitch. The optical-connector coupling component 14 has holes 14a into which projections 20a of the optical connector 20 are to be respectively inserted. The optical connector 20 also has snapfits 20b.

By inserting the projections 20a of the optical connector 20 into the respective holes 14a of the optical-connector coupling component 14, the second optical-signal ends 132 are optically connected to the respective optical fibers 21 with precision and the connection is secured by the snapfits 20b.

The multichannel optical communication module 10 according to the first exemplary embodiment is capable of employing, as the light-emitting/receiving element array 12, a light-emitting/receiving element array with the standard pitch (250 µm) that is commonly used and available on the market. Even if such a commonly used light-emitting/receiving element array is used in the module 10, the module 10 can readily establish optical connection without requiring the coupling by the optical-connector coupling component 14 to be highly accurate and thus can be produced at low cost. This is because the module 10 is capable of being coupled to the optical connector 20 that holds the optical fibers 21 of a large core diameter aligned with a pitch longer than the standard pitch.

In addition, the multichannel optical communication module 10 according to the first exemplary embodiment has such an advantage that it is made further slim by enabling the light-emitting/receiving element array 12 to emit or receive signal light traveling in the direction perpendicular to the surface of the board 11.

Now, there will be described an example of a method of producing the multichannel optical communication module 10 shown in FIG. 1.

Figure 2:
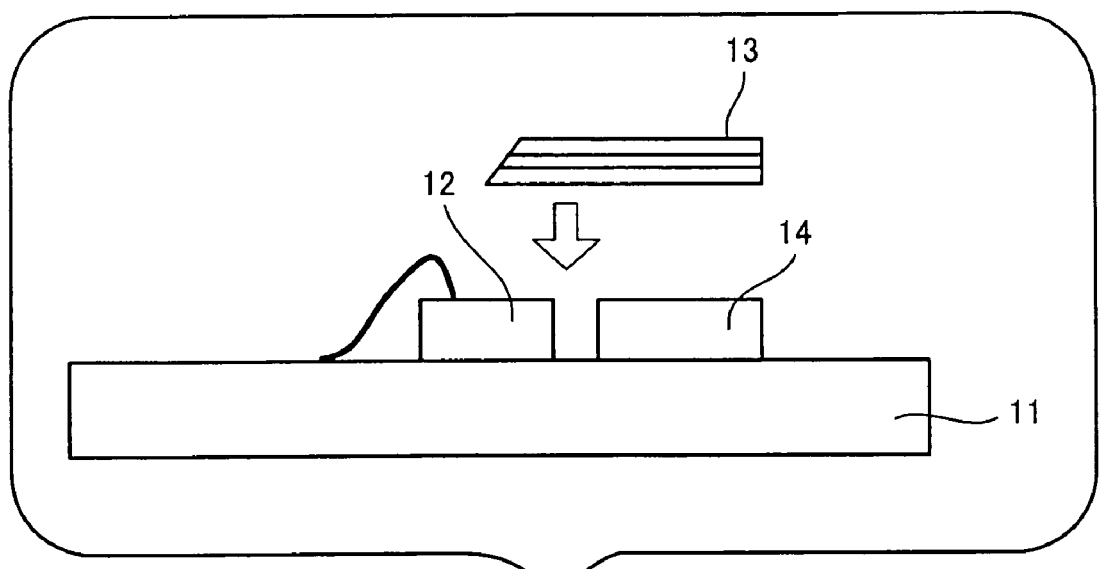
FIG. 2 is a diagram showing a first process in a method of producing the multichannel optical communication module shown in FIG. 1.

FIG. 2 is a diagram showing a first process in the method of producing the multichannel optical communication module 10 shown in FIG. 1.

First, the light-emitting/receiving element array 12 and the optical-connector coupling component 14 are disposed on the board 11 and then passed through a reflow furnace (not shown) to be fixed on the board 11. The light-emitting/receiving element array 12 is electrically connected to the board 11 with a wirebond. On the light-emitting/receiving element array 12 and the optical-connector coupling component 14 thus fixed on the board 11, the film-shaped optical waveguide 13 is disposed. The optical-connector coupling component 14 also serves as a support member for supporting the under surface of the film-shaped optical waveguide 13.

Figure 3:
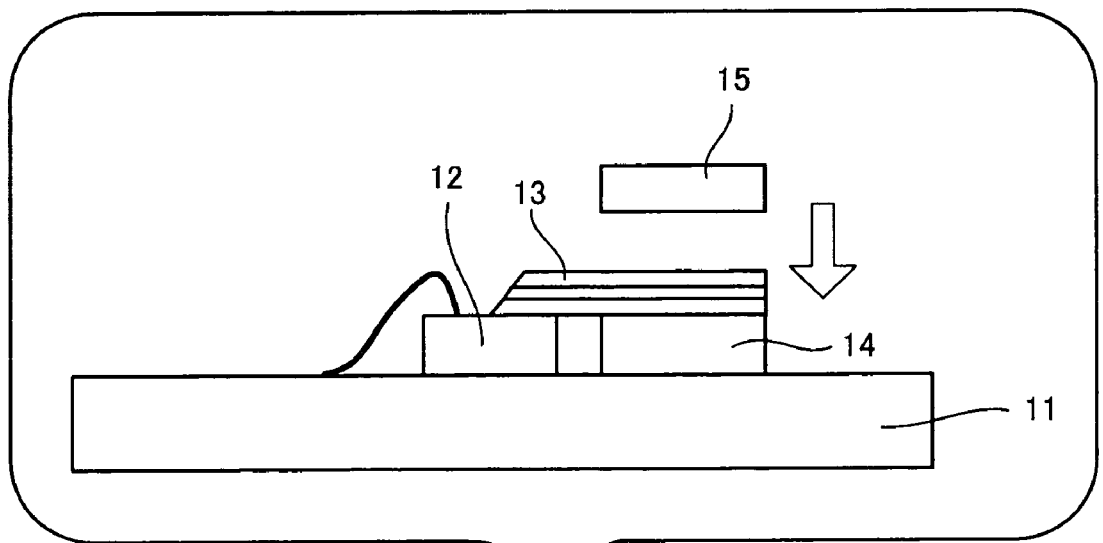
FIG. 3 is a diagram showing a second process in the method of producing the multichannel optical communication module shown in FIG. 1.

FIG. 3 is a diagram showing a second process in the method of producing the multichannel optical communication module 10 shown in FIG. 1.

As shown in FIG. 3, on the film-shaped optical waveguide 13 disposed on the light-emitting/receiving element array 12 and the optical-connector coupling component 14, a pressing member 15 is disposed to secure the top surface of the film-shaped optical waveguide 13.

In the manner described above with reference to FIGS. 2 and 3, the multichannel optical communication module 10 shown in FIG. 1 can be produced.

Figure 4:
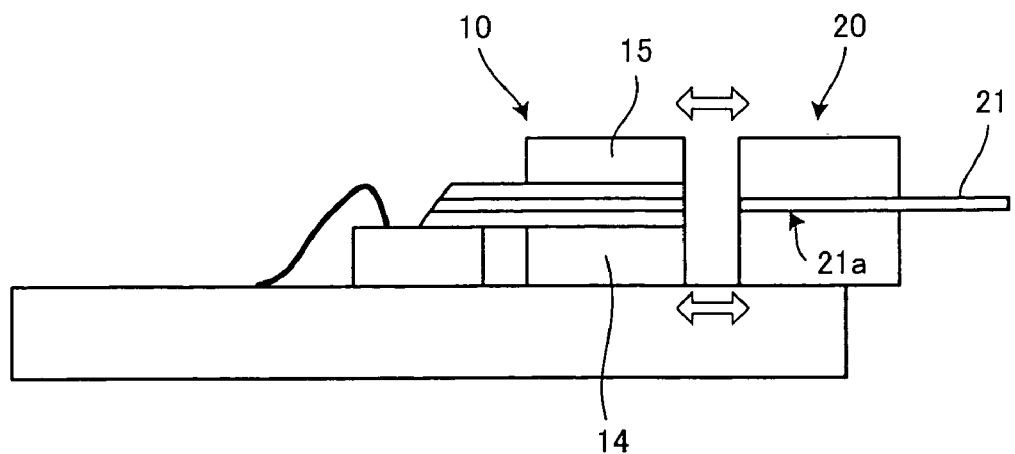
FIG. 4 is a side view of the completed optical communication module and an optical connector, which are about to be coupled to each other.

FIG. 4 is a side view of the completed optical communication module 10 and the optical connector 20, which are about to be coupled to each other.

As shown in FIG. 4, the film-shaped optical waveguide 13 is supported by the optical-connector coupling component 14 from below and pressed by the pressing member 15 from above. Therefore, the optical waveguide cores 13a of the film-shaped optical waveguide 13 can be securely connected to the respective ends 21a of the optical fibers 21 held by the optical connector 20.

Next, a second exemplary embodiment of the invention will be described.

The second exemplary embodiment is similar to the first exemplary embodiment in terms of configuration and thus, the same elements as those of the first exemplary embodiment will be denoted by the same reference characters as those of the first exemplary embodiment. Accordingly, the following description of the second exemplary embodiment will focus on the difference, and assumes that the optical connector 20 described in the first exemplary embodiment is similarly used.

Figure 5:
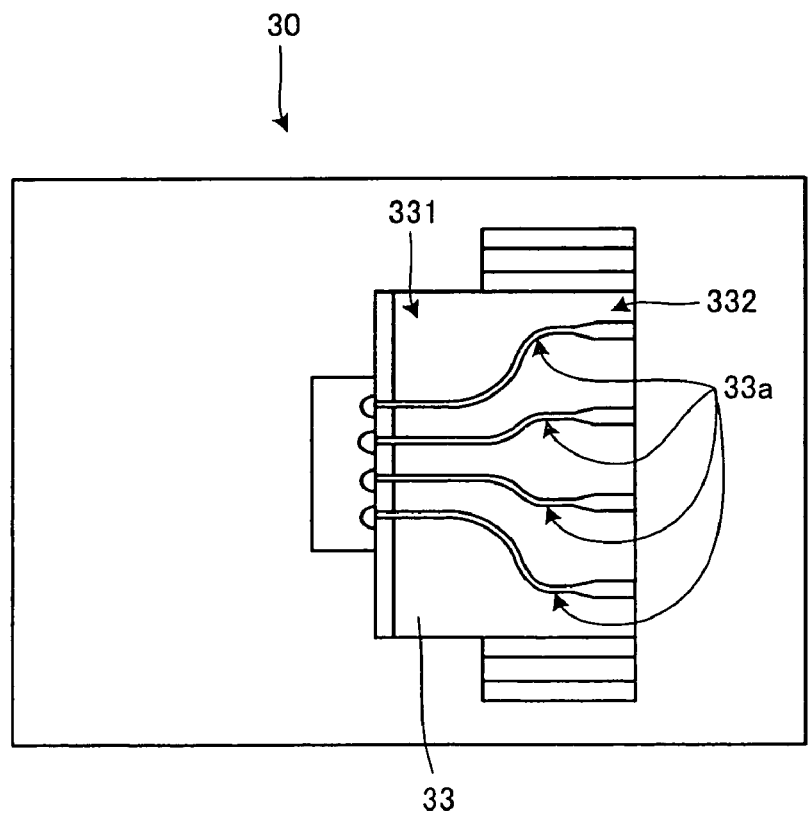
FIG. 5 is a schematic diagram showing a multichannel optical communication module according to a second exemplary embodiment of the invention.

FIG. 5 is a schematic diagram showing a multichannel optical communication module according to the second exemplary embodiment of the invention.

FIG. 5 shows a multichannel optical communication module 30 as another example of the "multichannel optical communication module" of the invention.

The multichannel optical communication module 30 shown in FIG. 5 has a film-shaped optical waveguide 33 that is another example of the "optical waveguide" according to the invention.

The optical waveguide 33 shown in FIG. 5 includes four optical waveguide cores 33a each having a first optical-signal end 331 and a second optical-signal end 332 that are opposed to each other. The first optical-signal ends 331 are aligned with a pitch equal to the first pitch (refer to the above-described first exemplary embodiment as to the definition of the first pitch) and optically connected to the respective optical-action points 121. The second optical-signal ends 332 are aligned with a second pitch longer than the first pitch, and each have a cross-sectional area larger than a cross-sectional area of each of the first optical-signal ends 331.

The multichannel optical communication module 30 according to the second exemplary embodiment may employ, as the optical connector 20, an optical connector that holds optical fibers each having a large core diameter. In this case, it is possible to increase the light-receiving efficiency obtained when the second optical-signal ends 332 are optically connected to the optical fibers.

Now, a third exemplary embodiment of the invention will be described.

The third exemplary embodiment is similar to the first exemplary embodiment in terms of configuration and thus, the same elements as those of the first exemplary embodiment will be denoted by the same reference characters as those of the first exemplary embodiment. Accordingly, the following description of the third exemplary embodiment will focus on the difference, and assumes that the optical connector 20 described in the first exemplary embodiment is similarly used.

Figure 6:
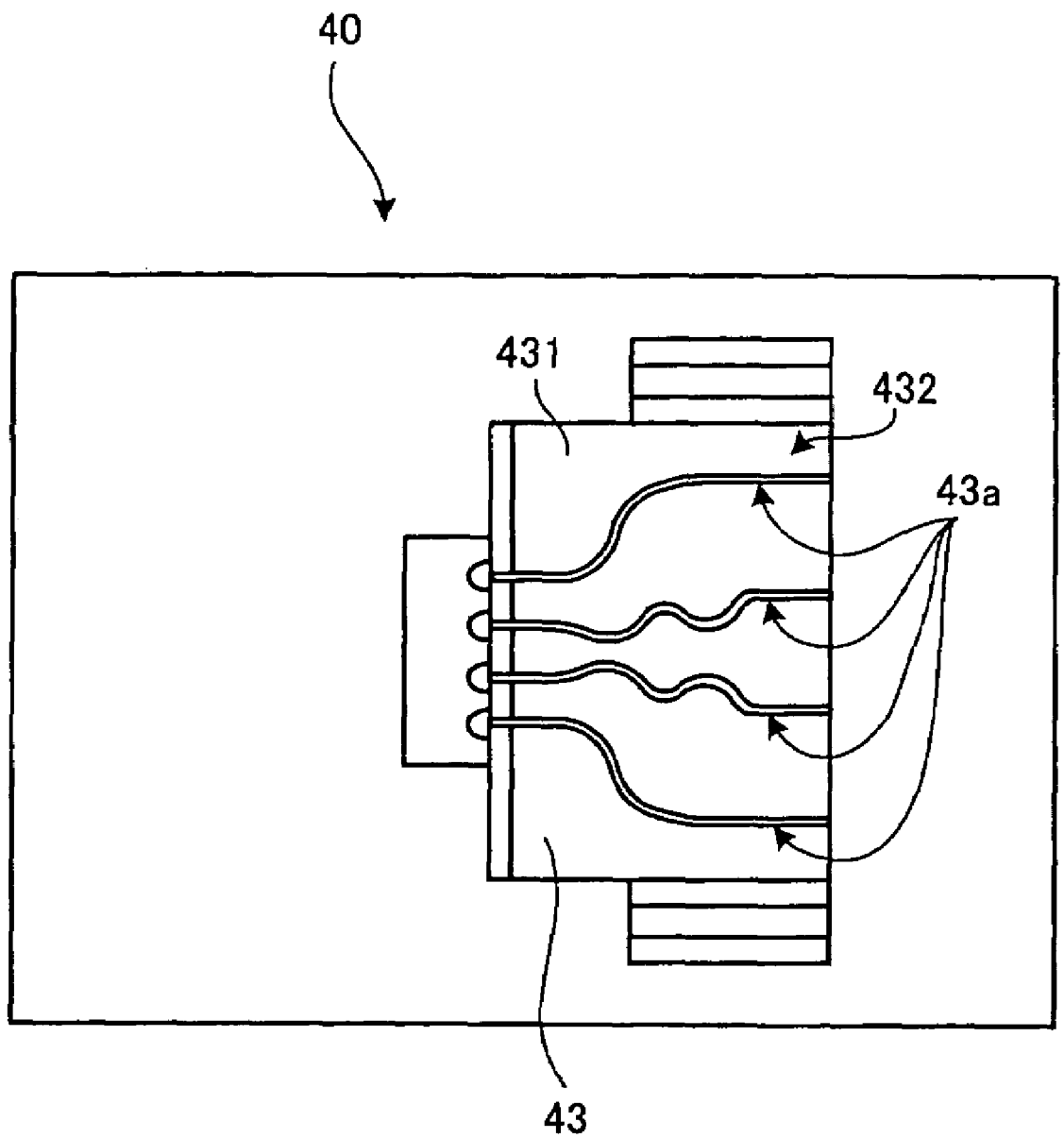
FIG. 6 is a schematic diagram showing a multichannel optical communication module according to a third exemplary embodiment of the invention.

FIG. 6 is a schematic diagram showing a multichannel optical communication module according to the third exemplary embodiment of the invention.

FIG. 6 shows a multichannel optical communication module 40 as another example of the "multichannel optical communication module" of the invention.

The multichannel optical communication module 40 shown in FIG. 6 has a film-shaped optical waveguide 43 that is another example of the "optical waveguide" according to the invention.

The optical waveguide 43 shown in FIG. 6 includes four optical waveguide cores 43a each having a first optical-signal end 431 and a second optical-signal end 432 that are opposed to each other. The first optical-signal ends 431 are aligned with a pitch equal to the first pitch (refer to the above-described first exemplary embodiment as to the definition of the first pitch) and optically connected to the respective optical-action points 121. The second optical-signal ends 432 are aligned with a second pitch longer than the first pitch. The optical waveguide cores 43a are of the same lengths.

The multichannel optical communication module 40 according to the third exemplary embodiment can prevent occurrence of a phase shift due to the difference in lengths of the optical waveguide cores 43a.

The above-described exemplary embodiments each employ a film-shaped optical waveguide as an example of the "optical waveguide" of the invention. However, the "optical waveguide" of the invention is not limited to the above-described examples and may be shaped like, for example, a plate.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The exemplary embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A multichannel optical communication module comprising:
   a board;
   a signal-converting element that has a plurality of optical-action points aligned with a predetermined first pitch to emit and receive signal light and performs conversion between an optical signal and an electric signal at each of the optical-action points;
   an optical waveguide that includes a plurality of optical waveguide cores each having a first optical-signal end and a second optical-signal end that are opposed to each other, the first optical-signal ends being aligned with a first pitch and optically connected to the respective optical-action points, while the second optical-signal ends being aligned with a second pitch, wherein the second pitch in a direction parallel to the board is longer than the first pitch in the direction parallel to the board; and
   an optical-connector coupling component that is fixed on the board and couples, to the module, an optical connector that holds ends of a plurality of optical fibers aligned with a pitch equal to the second pitch, thereby optically connecting the second optical-signal ends to the optical fibers,
   wherein the first pitch is about 250 μm.

2. The multichannel optical communication module according to claim 1, wherein the optical-action points of the signal-converting element emit and receive signal light traveling in a direction perpendicular to a surface of the board, and
   the first optical-signal ends of the optical waveguide cores have an optical-waveguide changing section that changes a traveling direction of signal light from the direction perpendicular to the surface of the board to a direction parallel to the surface of the board and vice versa.

3. The multichannel optical communication module according to claim 1, wherein the second optical-signal ends of the optical waveguide cores each have a cross-sectional area larger than a cross-sectional area of each of the first optical-signal ends.

4. A multichannel optical communication module comprising:
   a board;
   a signal-converting element that has a plurality of optical-action points aligned with a predetermined first pitch to emit and receive signal light and performs conversion between an optical signal and an electric signal at each of the optical-action points;
   an optical waveguide that includes a plurality of optical waveguide cores each having a first optical-signal end and a second optical-signal end that are opposed to each other, wherein the optical waveguide cores are of the same lengths, the first optical-signal ends being aligned with a first pitch and optically connected to the respective optical-action points, while the second optical-signal ends being aligned with a second pitch, wherein the second pitch in a direction parallel to the board is longer than the first pitch in the direction parallel to the board; and
   an optical-connector coupling component that is fixed on the board and couples, to the module, an optical connector that holds ends of a plurality of optical fibers aligned with a pitch equal to the second pitch, thereby optically connecting the second optical-signal ends to the optical fibers.

5. The multichannel optical communication module according to claim 1, wherein the optical-connector coupling component has a connecting section defining a hole, and the optical connector has a projection to be inserted into the hole and a snapfit, the optical connector being coupled to the module by the projection inserted into the hole and the snapfit.

6. The multichannel optical communication module according to claim 1, wherein the optical-connector coupling component supports a surface of the optical waveguide, and the multichannel optical communication module has a pressing member that presses a reverse side of the surface supported by the optical-connector coupling component.

7. A method of producing a multichannel optical communication module, comprising:
   fixing, on a board, a signal-converting element that has a plurality of optical-action points aligned with a predetermined first pitch to emit and receive signal light and performs conversion between an optical signal and an electric signal at each of the optical-action points to connect electrically the signal-converting element to the board;
   fixing, on the board, an optical-connector coupling component to be joined to an optical connector that holds ends of a plurality of optical fibers aligned with a second pitch, wherein the second pitch in a direction parallel to the board is longer than the first pitch in the direction parallel to the board;
   disposing, on the signal-converting element and the optical-connector coupling component fixed on the board, an optical waveguide that includes a plurality of optical waveguide cores each having a first optical-signal end and a second optical-signal end that are opposed to each other, the first optical-signal ends being aligned with a pitch equal to the first pitch and to be optically connected to the respective optical-action points, while the second optical-signal ends being aligned with a pitch equal to the second pitch, and
   disposing, on the optical waveguide disposed on the signal-converting element and the optical-connector coupling component, a pressing member that presses a top surface of the optical waveguide.

* * * * *